(12) United States Patent  
Ryu et al.

(10) Patent No.: US 7,696,478 B2
(45) Date of Patent: Apr. 13, 2010

(54) RESISTIVE MATERIALS FOR MICROBOLOMETER, METHOD FOR PREPARATION OF RESISTIVE MATERIALS AND MICROBOLOMETER CONTAINING THE RESISTIVE MATERIALS

(75) Inventors: Ho Jun Ryu, Seoul (KR); Woo Seok Yang, Daejeon (KR); Seong Mok Cho, Daejeon (KR); Sang Hoon Cheon, Daejeon (KR); Byoung Gon Yu, Daejeon (KR); Chang Auck Choi, Daejeon (KR)

(73) Assignee: Electronics and Telecommunication Research Institute, Daejeon (KR)

( * ) Notice: Subject to any disclaimer, the term of this patent is extended or adjusted under 35 U.S.C. 154(b) by 7 days.

(21) Appl. No.: 12/182,496

(22) Filed: Jul. 30, 2008

(65) Prior Publication Data

US 2009/0146058 A1 Jun. 11, 2009

(30) Foreign Application Priority Data

Dec. 7, 2007 (KR) ...................... 10-2007-0126847

(51) Int. Cl.
*G01J 5/00* (2006.01)

(52) U.S. Cl. .................................. 250/338.1

(58) Field of Classification Search ............... 250/338.1
See application file for complete search history.

(56) References Cited

U.S. PATENT DOCUMENTS

| 6,838,669 | B1 * | 1/2005 | Goebel et al. | ............ 250/338.4 |
| 6,927,392 | B2 | 8/2005 | Liddiard | |
| 7,442,933 | B2 * | 10/2008 | Lin | ......................... 250/338.1 |
| 2006/0060786 | A1 * | 3/2006 | Vilain | ..................... 250/338.1 |

FOREIGN PATENT DOCUMENTS

| JP | 11-271145 A | 10/1999 |
| KR | 2001-0028525 A | 4/2001 |
| KR | 2001-0056678 A | 7/2001 |
| KR | 2008-0052169 A | 6/2008 |

OTHER PUBLICATIONS

Hogue et al., "Space mid-IR detectors from DRS", IR Space Telescopes and Instruments, Proceedings of the SPIE, vol. 4850, 2003, p. 880-889.

* cited by examiner

*Primary Examiner*—David P Porta
*Assistant Examiner*—Mindy Vu
(74) *Attorney, Agent, or Firm*—Rabin & Berdo, P.C.

(57) ABSTRACT

Provided are resistive materials for a microbolometer, a method for preparation of resistive materials and a microbolometer containing the resistive materials. The resistive materials for the microbolometer include an alloy of silicon and antimony or an alloy of silicon, antimony and germanium, which has a high TCR and a low resistance.

4 Claims, 2 Drawing Sheets

RESISTIVE MATERIALS FOR MICROBOLOMETER, METHOD FOR PREPARATION OF RESISTIVE MATERIALS AND MICROBOLOMETER CONTAINING THE RESISTIVE MATERIALS

CROSS-REFERENCE TO RELATED APPLICATION

This application claims priority to and the benefit of Korean Patent Application No. 2007-126847, filed Dec. 7, 2007, the disclosure of which is incorporated herein by reference in its entirety.

BACKGROUND

1. Field of the Invention

The present invention relates to resistive materials for a microbolometer, a method for preparation of resistive materials, and a microbolometer containing the resistive materials, and more particularly to using an alloy of silicon and antimony or an alloy of silicon, antimony and germanium as resistive materials for a microbolometer.

This work was supported by the IT R&D program of MIC/IITA [2006-S-054-02, Development of multifunctional sensor technology of CMOS-based micro electro mechanical system (MEMS) for Ubiquitous].

2. Discussion of Related Art

To sense infrared, various methods are used according to infrared wavelength ranges to be sensed.

To sense near infrared, a photon-type infrared sensor is used. The photon-type infrared sensor, which uses a photovoltaic effect of a semiconductor to sense a photon due to absorbed infrared, has advantages of good sensitivity and short response time. However, the photon-type infrared sensor has a defect of requiring a cryogenic cooling system when operating at the highest sensitivity.

On the other hand, in the case of a sensor of sensing mid or far infrared, a device capable of sensing heat generated by infrared has been generally used. The infrared sensor capable of sensing heat is classified into a bolometer type, a thermocouple type, and a pyroelectric type according to sensing method. Although the heat-type infrared sensor has lower sensitivity and longer response time than the photon-type infrared sensor, it has attracted attention for its aptness for minimization and various applications since the heat-type infrared sensor does not need the cryogenic cooling system. Generally, such a no-cooling infrared sensor senses an infrared wavelength that ranges from 8 to 14 microns. To manufacture the no-cooling infrared sensor, a substrate and a multilayer membrane structure having a certain thickness (i.e., a thickness corresponding to a quarter of a center wavelength) are needed. Such a membrane includes an absorbing layer, an insulating layer, a resistive layer, an electrode layer, etc. Among them, the resistive layer may govern the performance of the microbolometer.

At the present time, vanadium oxide is most used resistive material for the microbolometer. $V_2O_5$ and $VO_2$ are the most commonly used compositions. Between them, $VO_2$ is employed as the resistive material for the microbolometer.

Vanadium oxide shows various values of a temperature coefficient of resistance (TCR) according to oxygen content and metal components used in doping. If $VO_2$ whose oxygen content is properly adjusted is used as the resistive material, it is known that a TCR is approximately −2 to −4% K. Further, it is also known that there is little Johnson noise since a fabricated thin film has relatively low resistance, and noise due to frequency variation is very low.

Generally, a sputtering method is used for producing vanadium oxide. In the case of $VO_2$, it is very difficult to precisely adjust the composition. Because of such process characteristics, it is very hard to apply a semiconductor batch process to a matching process with a micro electro mechanical system (MEMS) structure.

Meanwhile, to overcome the difficulty in the process using vanadium oxide, research into a microbolometer that employs amorphous silicon as the resistive material has been carried out. However, the resistive material of amorphous silicon shows a TCR lower than that of vanadium oxide, and a high resistance having an effect on noise when a signal is reproduced. In the case of the microbolometer produced by Texas Instrument Incorporated and L-3 Company, it has been reported that the resistance thereof reaches 10 to 30 MΩ if the thickness of amorphous silicon ranges from 100 to 200 nm. However, such a resistance causes 1/f noise, and thus the performance of the microbolometer is deteriorated. Further, a low resistance allows a higher degree of freedom when designing a read out integrated circuit (ROIC) for processing a signal generated by the infrared sensor.

Accordingly, the present invention proposes a silicon alloy, which lowers the resistance while maintaining the TCR close to that of vanadium oxide, as the resistive material for the microbolometer

SUMMARY OF THE INVENTION

The present invention is directed to resistive materials for a microbolometer that has a high TCR and a low resistance and senses an infrared wavelength ranging from 8 to 14 microns by adding antimony to silicon or adding antimony and germanium to silicon.

According to an aspect of the present invention, there is provided a resistive material for a microbolometer comprising an alloy of silicon and antimony wherein the alloy has a composition of $Si_xSb_{1-x}$ ($40 \leq x \leq 55$).

According to another aspect of the present invention, there is provided a resistive material for a microbolometer comprising an alloy of silicon, antimony and germanium, wherein germanium is added by 24 at % through 33 at % while maintaining a relative ratio of silicon and antimony to $Si_xSb_{1-x}$ ($40 \leq x \leq 55$).

According to still another aspect of the present invention, there is provided a method of preparing a resistive material for a microbolometer, including: preparing two chambers having independent targets to which radio frequency (RF) or direct current (DC) power is applied; independently introducing silicon and antimony into the respective chambers, for producing the alloy of silicon and antimony; and controlling composition of the alloy by independently applying power to the respective chambers.

According to yet another aspect of the present invention, there is provided a method of preparing a resistive material for a microbolometer, including: preparing three chambers having independent targets to which radio frequency (RF) or direct current (DC) power is applied; independently introducing silicon, antimony and germanium into the respective chambers, for producing the alloy of silicon, antimony and germanium; and controlling composition of the alloy by independently applying the power to the respective chambers.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

Figure 1:
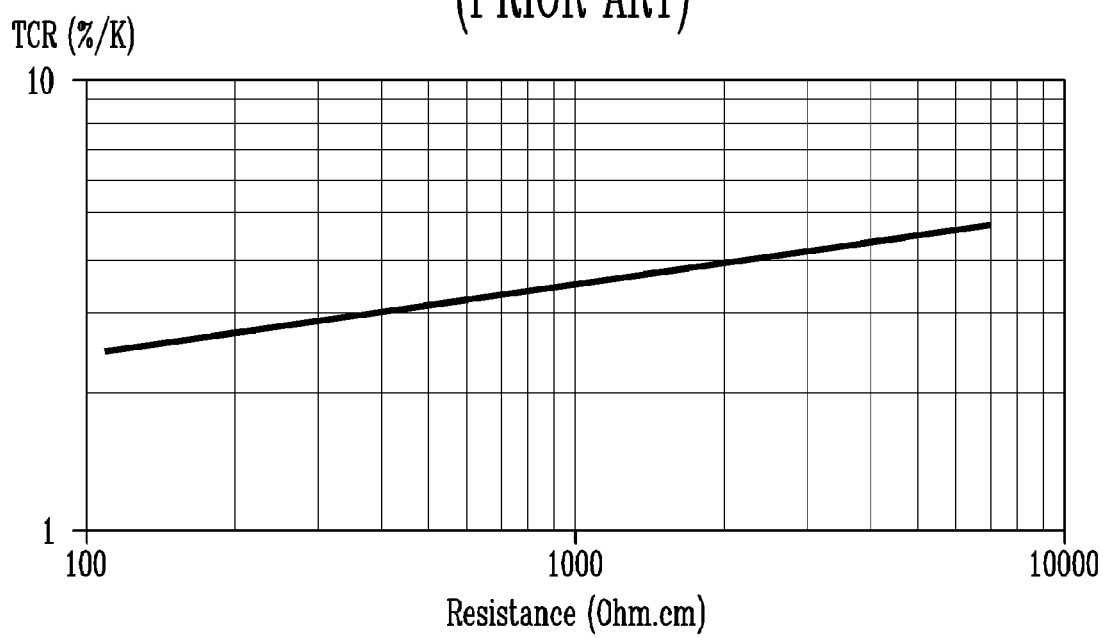
FIG. 1 is a temperature coefficient of resistance (TCR) graph of a conventional case that amorphous silicon is used as a resistive material.

According to an embodiment of the present invention, resistive materials for a microbolometer include an alloy whose composition of silicon and antimony is $Si_xSb_{1-x}$ ($40 \leq x \leq 55$), and an alloy whose composition of germanium is adjusted within a range from 24 at % to 33 at % is added while maintaining a relative ratio of silicon and antimony to $Si_xSb_{1-x}$ ($40 \leq x \leq 55$). For example, the alloy consisting of silicon, antimony and germanium may be $Si_{30.4}SB_{45.6}Ge_{24}$ or $Si_{26.8}SB_{40.2}Ge_{33}$.

The above-described alloy consisting of silicon and antimony or consisting of silicon, antimony and germanium is produced by a magnetron sputtering method.

To perform the magnetron sputtering method, two or three chambers having independent targets are needed, and the chambers have to be configured to independently receive radio frequency (RF) or direct current (DC) power.

To produce a silicon based alloy consisting of silicon and antimony or consisting of silicon, antimony and germanium, the RF or DC power applied to each target has to be independently controlled to adjust the composition thereof.

In case of the resistive material whose composition of silicon and antimony is $Si_xSb_{1-x}$ ($40 \leq x \leq 55$), the power applied to the silicon is adjusted to 200-300 W; and the power applied to antimony is adjusted to 50-125 W.

Further, in case of the resistive material in which germanium adjusted within the range from 24 at % to 33 at % is added while maintaining the relative ratio of silicon and antimony to $Si_xSb_{1-x}$ ($40 \leq x \leq 55$), the power applied to silicon is adjusted to 200-300 W; the power applied to antimony is adjusted to 15-75 W; and the power applied to germanium is adjusted to 50-200 W.

With this power condition, argon gas is introduced to the chamber so that the chamber can be controlled to have an inner pressure between 2 mTorr and 5 mTorr to deposit the silicon based alloy.

Further, a sample is controlled to have a temperature of 200-400° C. to thereby smoothly synthesize the silicon based alloy.

The alloy of silicon and antimony or the alloy of silicon, antimony and germanium, produced as described above, is employed as the resistive material in a focal plane array, so that it can be used for the microbolometer.

Embodiments 1 through 19

Two chambers having independent targets to which the RF or DC power is applied were prepared. To produce the alloy of silicon and antimony, silicon and antimony, samples were introduced into the chambers, respectively. Then, to deposit the alloy, the chambers were controlled to have a pressure of 5 mTorr, and the samples were heated to 200° C. Then, as shown in the following table 1, the power ranging from 200 W to 300 W is applied to the chamber having silicon, and the power ranging from 50 W to 125 W is applied to the chamber having antimony, thereby producing the alloy of silicon and antimony.

The TCR and the resistance of the alloy produced according to the foregoing embodiments are as follows.

TABLE 1

| No. | POWER (watt) Si | POWER (watt) Sb | SAMPLE (° C.) TEMPERATURE | TCR (%/K) | Rs (Ω) |
|---|---|---|---|---|---|
| 1  | 200 | 50  | 200 | −2.44 | 8.33E+05 |
| 2  | 200 | 75  | 200 | −2.55 | 5.57E+05 |
| 3  | 250 | 50  | 200 | −2.73 | 2.39E+06 |
| 4  | 250 | 75  | 200 | −2.57 | 6.75E+05 |
| 5  | 300 | 50  | 200 | −2.66 | 4.52E+06 |
| 6  | 300 | 75  | 200 | −2.45 | 1.44E+06 |
| 7  | 300 | 100 | 200 | −2.52 | 9.44E+05 |
| 8  | 200 | 50  | 300 | −2.46 | 1.18E+06 |
| 9  | 200 | 75  | 300 | −2.5  | 5.19E+05 |
| 10 | 250 | 50  | 300 | −2.61 | 2.66E+06 |
| 11 | 250 | 75  | 300 | −2.63 | 1.58E+06 |
| 12 | 250 | 100 | 300 | −2.59 | 5.65E+05 |
| 13 | 300 | 50  | 300 | −2.43 | 2.48E+06 |
| 14 | 300 | 75  | 300 | −2.4  | 1.10E+06 |
| 15 | 300 | 100 | 300 | −2.51 | 6.28E+05 |
| 16 | 300 | 50  | 400 | −2.54 | 4.20E+06 |
| 17 | 300 | 75  | 400 | −2.43 | 1.42E+06 |
| 18 | 300 | 100 | 400 | −2.45 | 9.86E+05 |
| 19 | 300 | 125 | 400 | −2.41 | 5.94E+05 |

Figure 2:
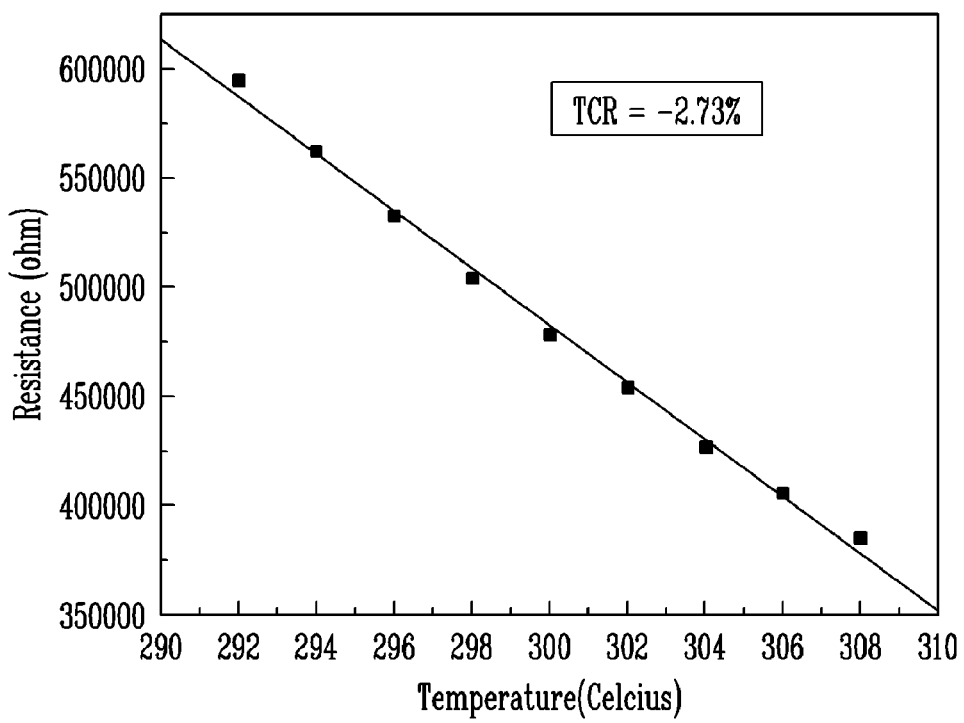
FIG. 2 is a TCR graph of a silicon-antimony alloy according to an embodiment of the present invention.

Among the embodiments, FIG. 2 shows the TCR of when the deposition pressure is 5 mTorr, the power applied to silicon is 250 W, the power applied to antimony is 50 W, and the temperature for heating the sample is 200° C. In this case, the resistance is 2.4 MΩ, which is lower than that of amorphous silicon produced by a plasma enhanced chemical vapor deposition (PECVD) method shown in FIG. 1.

Figure 3:
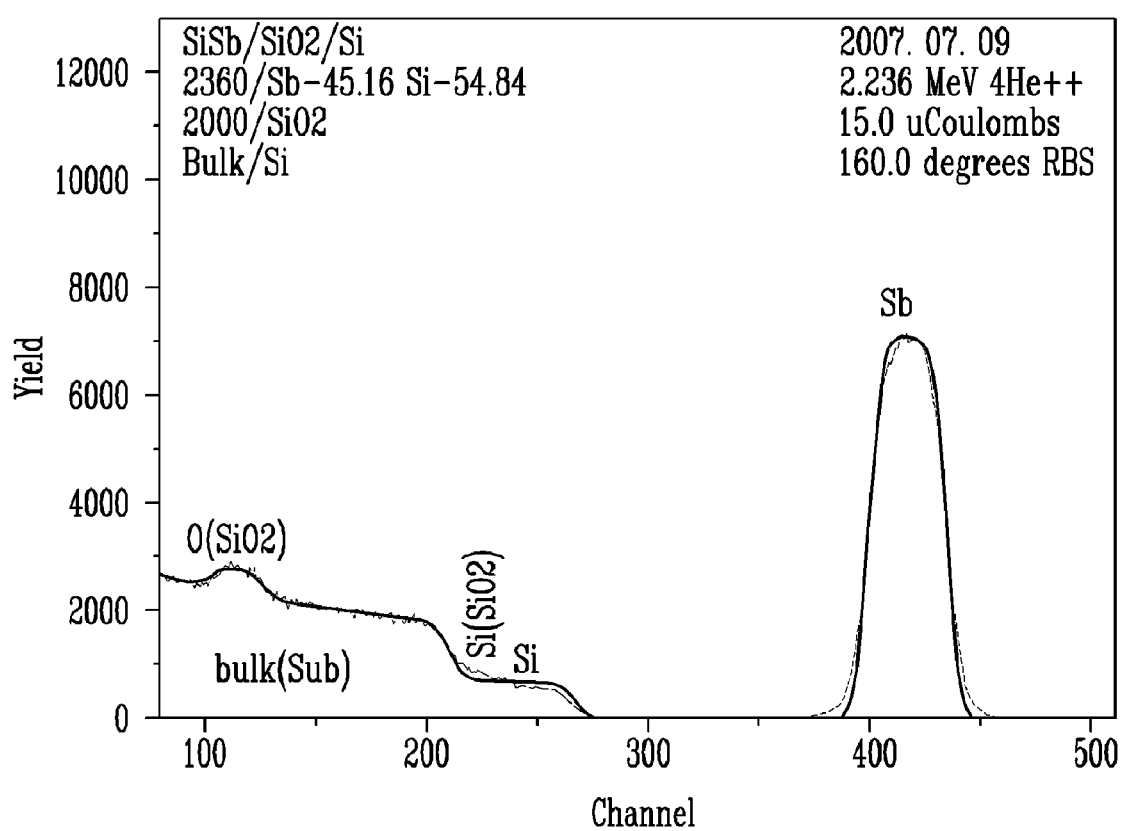
FIG. 3 is a composition analysis graph of a silicon-antimony alloy according to an embodiment of the present invention.

In the composition of silicon and antimony for getting the optimum properties, silicon may range from 40% to 55% (atomic ratio), and antimony may range from 40% to 60% (atomic ratio). FIG. 3 shows results from analyzing the composition through Rutherford backscattering spectroscopy (RBS). Further, the composition change may be achieved by controlling the power applied to each target.

Meanwhile, in the case of adding both antimony and germanium to silicon, the optimum TCR and resistance can result from adjusting the composition of germanium to 24% through 33% (atomic ration) while maintaining the relative ratio of silicon and antimony to the foregoing condition.

As described above, the present invention provides an alloy of silicon and antimony, or an alloy of silicon, antimony and germanium, which has a TCR similar to that of vanadium oxide and a resistance lower than that of the amorphous silicon, so that 1/f noise is reduced and a higher degree of freedom when designing a read-out integrated circuit (ROIC) is allowed, thereby enabling various designs.

Although exemplary embodiments of the present invention have been disclosed for illustrative purposes, those skilled in the art will appreciate that various modifications, additions, and substitutions are possible, without departing from the scope of the present invention. Therefore, the present invention is not limited to the above-described embodiments, but is defined by the following claims, along with their full scope of equivalents.

What is claimed is:

1. A resistive material for a microbolometer comprising an alloy of silicon and antimony, wherein the alloy has a composition of $Si_xSb_{1-x}(40 \leqq x \leqq 55)$.

2. A microbolometer using the resistive material according to claim 1.

3. A resistive material for a microbolometer comprising an alloy of silicon, antimony and germanium, wherein germanium is added by 24-33 at % while maintaining a relative ratio of silicon and antimony to $Si_xSb_{1-x}(40 \leqq x \leqq 55)$.

4. A microbolometer using the resistive material according to claim 3.

* * * * *

UNITED STATES PATENT AND TRADEMARK OFFICE
CERTIFICATE OF CORRECTION

PATENT NO. : 7,696,478 B2
APPLICATION NO. : 12/182496
DATED : April 13, 2010
INVENTOR(S) : Ho Jun Ryu et al.

It is certified that error appears in the above-identified patent and that said Letters Patent is hereby corrected as shown below:

IN THE SPECIFICATION:

In column 2, line 42, change "$Si_xSb_{1-x}(40 \leq x \leq 55)$" to --$Si_xSb_{1-x}(0.40 \leq x \leq 0.55)$--;

In column 2, lines 47-48, change "$Si_xSb_{1-x}(40 \leq x \leq 55)$" to --$Si_xSb_{1-x}(0.40 \leq x \leq 0.55)$--;

In column 3, lines 25-26, change "$Si_xSb_{1-x}(40 \leq x \leq 55)$" to --$Si_xSb_{1-x}(0.40 \leq x \leq 0.55)$--;

In column 3, line 29, change "$Si_xSb_{1-x}(40 \leq x \leq 55)$" to --$Si_xSb_{1-x}(0.40 \leq x \leq 0.55)$--;

In column 3, line 46, change "$Si_xSb_{1-x}(40 \leq x \leq 55)$" to --$Si_xSb_{1-x}(0.40 \leq x \leq 0.55)$--;

In column 3, line 53, change "$Si_xSb_{1-x}(40 \leq x \leq 55)$" to --$Si_xSb_{1-x}(0.40 \leq x \leq 0.55)$--;

In column 4, line 54, change "40% to 60%" to --45% to 60%--.

IN THE CLAIMS:

Claim 1, column 6, line 4, change "$Si_xSb_{1-x}(40 \leq x \leq 55)$" to --$Si_xSb_{1-x}(0.40 \leq x \leq 0.55)$--;

Claim 3, column 6, line 10, change "$Si_xSb_{1-x}(40 \leq x \leq 55)$" to --$Si_xSb_{1-x}(0.40 \leq x \leq 0.55)$--.

Signed and Sealed this

Twenty-first Day of December, 2010

David J. Kappos
*Director of the United States Patent and Trademark Office*